(12) United States Patent
Lu

(10) Patent No.: US 7,187,117 B2
(45) Date of Patent: Mar. 6, 2007

(54) METHOD FOR FORMING A PHOTOSENSITIVE PIXEL-DEFINING LAYER ON AN OLED PANEL

(75) Inventor: Tien-Rong Lu, Tainan (TW)

(73) Assignee: Ritek Display Technology Co., Hsinchu Hsien (TW)

( * ) Notice: Subject to any disclaimer, the term of this patent is extended or adjusted under 35 U.S.C. 154(b) by 415 days.

(21) Appl. No.: 09/791,824

(22) Filed: Feb. 26, 2001

(65) Prior Publication Data
US 2001/0035714 A1 Nov. 1, 2001

(30) Foreign Application Priority Data
Apr. 26, 2000 (TW) .................................. 89107927

(51) Int. Cl.
*H01J 1/62* (2006.01)
*H01J 63/04* (2006.01)
*H01J 9/00* (2006.01)
*B32B 9/00* (2006.01)

(52) U.S. Cl. .................... 313/504; 313/506; 445/24; 428/690

(58) Field of Classification Search ............ 313/504, 313/507, 498, 500, 505, 506; 315/169.3, 315/169.4, 169.1; 445/24; 428/690
See application file for complete search history.

(56) References Cited

U.S. PATENT DOCUMENTS

| | | | | |
|---|---|---|---|---|
| 5,701,055 A | * | 12/1997 | Nagayama et al. | 313/504 |
| 5,773,931 A | * | 6/1998 | Shi et al. | 313/509 |
| 6,013,538 A | * | 1/2000 | Burrows et al. | 438/22 |
| 6,157,127 A | * | 12/2000 | Hosokawa et al. | 313/506 |
| 6,414,432 B1 | * | 7/2002 | Hieda et al. | 313/506 |
| 6,570,323 B1 | * | 5/2003 | Nakamata et al. | 313/500 |
| 6,616,496 B1 | * | 9/2003 | Lu | 313/504 |
| 2001/0035393 A1 | * | 11/2001 | Lu | 216/23 |

* cited by examiner

*Primary Examiner*—Nimeshkumar D. Patel
*Assistant Examiner*—Peter Macchiarolo
(74) *Attorney, Agent, or Firm*—Bacon & Thomas PLLC

(57) ABSTRACT

A method for forming a pixel-defining layer on an OLED panel is disclosed. The method comprising (A) providing a substrate; (B) forming a plurality of first electrodes in parallel stripes; (C) forming a layer of photosensitive polyimide or polyimide precursor compositions with patterns; and (D) baking said substrate with patterned photosensitive polyimide or polyimide precursor compositions for crosslinking or curing. An OLED panel made by above method is also disclosed here.

5 Claims, 3 Drawing Sheets

METHOD FOR FORMING A PHOTOSENSITIVE PIXEL-DEFINING LAYER ON AN OLED PANEL

BACKGROUND OF THE INVENTION

1. Field of the Invention

The present invention relates to a method for the surface treatment of an OLED (organic light emitting devices) panel, especially relates to a method for forming a photosensitive pixel-defining layer on an OLED panel.

2. Description of Related Art

Currently, OLED displays attract much attention of scientists and researchers because of several advantages such as light weight, high contrast, high response rate, low power consumption and high brightness. The conventional method for manufacturing OLED displays including forming parallel stripes of anodes, parallel ramparts of photoresists which intersect the parallel anodes, organic electroluminescent layers and cathodes on a substrate subsequently. The photoresist ramparts act as shadow masks for the formation of pixels when further vapor depositing organic electroluminescent materials and cathodes on the exposed anodes between photoresist ramparts. However, as the cathodes form on the organic electroluminescent media between photoresist ramparts, the separation or insulation between the cathodes and the anodes is not so ideal since the borders of the pixels are only roughly defined by the photoresist ramparts or by the anodes. In many cases, the cathode materials deposited on the sidewalls of the photoresist ramparts contact with the anodes on the substrate to cause shorts. Therefore, the stability of OLED displays and the yield of manufacturing OLED displays are often poor. The lifetime of OLED displays is not acceptable.

Recently, a suggestion for improving the drawback by forming an insulating layer of SiO$_2$ between pixels and photoresist ramparts is proposed. However, the process for forming SiO$_2$ insulation layer is very complicate and costs high. The formation of SiO$_2$ layer for insulation is not suitable for the mass-production of OLED display panels. Another suggestion for exempting from these shorts by forming photoresist insulation layers between the anodes and the photoresist ramparts is proposed. However, since the photoresists release water or organic solvent vapor which will ruin the sensitive organic electroluminescent media in the OLED displays, the photoresist insulation layers are not the right answers to solve this problem. On the other hand, the photochemical stability of photoresist is low since there are many photosensitive chemicals in the photoresist compositions. Since the OLED display is operated under high brightness, the poor photochemical stability of the photoresist insulation layers does not result in durable insulation. Therefore, the lifetime of these OLED displays with photoresist insulation layer is not acceptable because of frequent high brightness of OLED displays.

Therefore, it is desirable to provide an improved method for manufacturing OLED panels to mitigate the aforementioned problems.

SUMMARY OF THE INVENTION

The object of the present invention is to provide a method for fabricating a pixel-defining layer on an OLED panel to clearly define the area of the pixels on said OLED panel and to separate cathodes from anodes for avoiding shorts.

Another object of the present invention is to provide a method for fabricating a pixel-defining layer on an OLED panel to increase the stability of the pixel-defining layer for electricity, heat and light, and extend the lifetime of said OLED panel.

Another object of the present invention is to provide a method for fabricating a pixel-defining layer to produce photosensitive polyimide pixel-defining layer stably, reduce the manufacturing cost and increase the yield.

To achieve the object, the method for forming a pixel-defining layer on an OLED panel of the present invention includes:

(A) providing a substrate;
(B) forming a plurality of first electrodes in parallel stripes on said substrate;
(C) coating a layer of photosensitive polyimide or polyimide precursor compositions on said substrate or selectively on said first electrodes;
(D) prebaking said substrate with said layer of said photosensitive polyimide or polyimide precursor compositions;
(E) forming patterns of said photoresist by exposing said substrate to masked radiation, and developing said exposed layer of said photosensitive polyimide or polyimide precursor compositions; and
(F) baking said substrate with patterned photosensitive polyimide or polyimide precursor compositions for crosslinking or curing said patterned photosensitive polyimide or polyimide precursor compositions to form said pixel-defining layer;

wherein said patterns of said layer of said photosensitive polyimide or polyimide precursor compositions divide said first electrodes into a plurality of open window areas which are not covered by said pixel-defining layer.

The method for forming a pixel-defining layer on an OLED panel of the present invention can further includes: (G) forming a plurality of ramparts on said substrate and selectively on said first electrodes or said stripes of said polyimide pixel-defining layer; wherein each rampart protrudes from said substrate and has overhanging portion projecting in a direction parallel to said substrate.

The method for forming a pixel-defining layer on an OLED panel of the present invention can further includes: (H) depositing organic electroluminescent media to the exposed area between said ramparts on said substrate or said first electrodes; and (I) forming a plurality of second electrodes on said organic electroluminescent media on said substrate or said first electrodes.

The method for forming a pixel-defining layer on an OLED panel of the present invention can selectively further comprising forming a plurality of auxiliary electrodes on or beneath the surface of said substrate before forming a plurality of said first electrodes on said substrate.

The OLED panel of the present invention comprises a substrate; a plurality of first electrodes in parallel stripes, said first electrodes locating on the surface of said substrate; a plurality of photoesnstive polyimide pixel-defining layers, said photoesenstive polyimide pixel-defining layers selectively locating on said substrate or on said first electrodes; a plurality of photoresist ramparts, said photoresist ramparts selectively locating on said first electrodes or on said pixel-defining layer; a plurality of organic electroluminescent media, said organic electroluminescent media locating in the exposed area between said ramparts on said substrate; and a plurality of second electrodes, said second electrodes locating on said organic electroluminescent media; wherein each said ramparts protruding from said substrate and having an overhanging portion projection in a direction parallel to said substrate; and said photoresist ramparts are formed through coating a compositions of photoresist on said substrate, exposing said substrate to masked radiation and development.

Another OLED panel of the present invention comprises: a substrate; a plurality of first electrodes in parallel stripes, said first electrodes located on the surface of said substrate; a plurality of photosensitive polyimide pixel-defining layers having a pattern of open window areas, said photosensitive polyimide pixel-defining layers selectively located on said substrate or on said first electrodes; a plurality of organic electroluminescent media, said organic electroluminescent media at least located in said open window areas on said substrate; and a plurality of second electrodes, said second electrodes located on said organic electroluminescent media; wherein said first electrodes and said second electrodes sandwiched said organic electroluminescent media in said open window areas of said layer of said photosensitive polyimide or polyimide precursor compositions.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
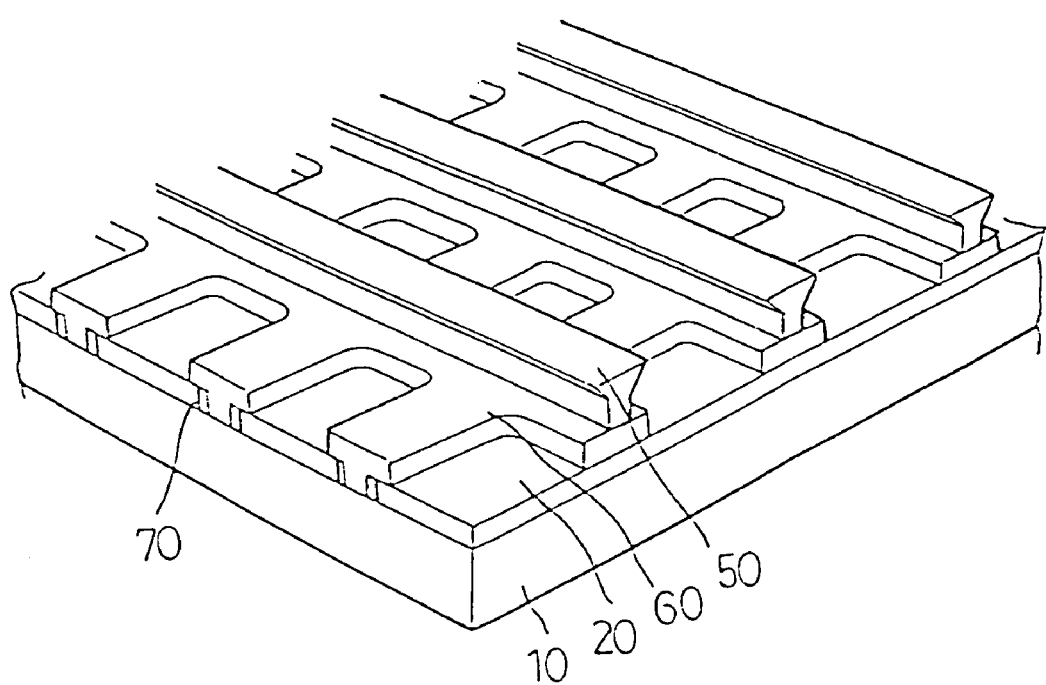
FIG. 1 is a partially enlarged perspective view of the panel of the present invention before formation of organic electroluminescent medium and cathodes (second electrodes)

The method of the invention for forming a pixel-defining layer on an OLED panel, comprising following steps: (A) providing a substrate; (B) forming a plurality of first electrodes in parallel stripes on said substrate; (C) coating a layer of photosensitive polyimide or polyimide precursor compositions on said substrate or selectively on said first electrodes; (D) prebaking said substrate with said layer of said photosensitive polyimide or polyimide precursor compositions; (E) forming patterns of said photoresist by exposing said substrate to masked radiation, and developing said exposed layer of said photosensitive polyimide or polyimide precursor compositions; and (F) baking said substrate with patterned photosensitive polyimide or polyimide precursor compositions for crosslinking or curing to form said pixel-defining layer; wherein said patterns of said layer of said photosensitive polyimide or polyimide precursor compositions divide said first electrodes into a plurality of open window areas which are not covered by said pixel-defining layer.

Since polyimides have better thermal, electrical, mechanical and photochemical stability than other conventional polymers for insulation, polyimides are good candidates for pixel-defining layers. On the other hand, the cured polyimides hardly release organic solvent to deteriorate the sensitive organic electroluminescent media of OLED panels. This advantage can extend the lifetime of the OLED panel. Moreover, the polyimide pixel-defining layers on the OLED panels of the present invention can separate the ITO anodes and the cathodes effectively from electrical shorts. By way of clear defining the pixel area and fully separating the anodes and the cathode materials, the polyimide pixel-defining layers can decrease the opportunity of shorts between anodes and the cathode materials, especially the cathode materials deposited close to the bottom of the sidewalls of the photoresist ramparts, on the OLED panels. Therefore, the yield of producing OLED panels can increase significantly. Furthermore, since only one exposure step and one development step is required for forming polyimide pixel-defining layers, the procedure is much simpler than the conventional process for forming insulation layers (either photoresist insulation layer or $SiO_2$ insulation layer) between anodes and cathodes on the OLED panels. Thus, the manufacturing coast is significantly reduced.

The substrate that applied in the process of the present invention can be transparent or not transparent. Preferably, the substrates used in the present invention are sodalime glasses, boron silica glasses, plastics or silicon wafers. The anode suitable for the present invention can be any conventional material for electrical conductance. Preferably, the fist electrode (anode) of the present invention can be $InSnO_3$, $SnO_2$, $In_2O_3$ doped with ZnO, CdSnO or antimony. The second electrode (cathode) suitable for the present invention can be any conventional material for electrical conductance. Preferably, the second electrode (cathode) of the present invention can be MgAg, BaCa, BaAl, Al, dimonds, like-dimond or Ca.

For the method for forming a pixel-defining layer of the present invention, a plurality of parallel auxiliary electrodes can be selectively formed on the substrate before the anodes are formed for providing better electrical conductance for first electrodes (anodes). In most cases, the parallel auxiliary electrodes form through lithography on the substrate. The materials of the auxiliary electrodes are not limited. Any conventional materials for good electrical conductance can be used. Preferably, the auxiliary electrode is Cr, Al, Cu, Ag or gold. The photosensitive polyimide can be coated on the substrate through any conventional method. Preferably, the photosensitive polyimide or polyimide precursor compositions is coated through spin-coating of 1000 to 3000 rpm on the substrate. The substrate coated with photosensitive polyimides or polyimide precursor compositions is prebaked at a temperature to drive out of the solvent inside the photosensitive polyimides or polyimide precursor compositions. Preferably, the coated substrate is prebaked at a temperature ranging from 120 to 160° C. The prebaked photosensitive polyimide or polyimide precursor compositions can be exposed to masked radiation and developed to form patterns. The development of the photosensitive polyimide or polyimide precursor compositions can be achieved by any conventional method and reagent. Preferably, the photosensitive polyimide or polyimide precursor compositions is developed by 2.38% of TMAH (tetramethyl ammonium hydroxide). The pattern of the photosensitive polyimide or polyimide precursor compositions is not limited. Preferably, the pattern of the photosensitive polyimide or polyimide precursor compositions is parallel stripes intersecting anodes perpendicularly or a stripe net with selective open portion areas on the first electrodes (anodes) on the substrate. The patterned photosensitive polyimide or polyimide precursor compositions can be baked at a temperature that the photosensitive polyimides or polyimide precursor compositions can crosslink or cure. Preferably, the baking temperature is at least higher than 400° C. Most preferably, the baking temperature for is at least higher than 450° C. The photosensitive polyimides or polyimide precursor compositions applied in the method of the present invention can be any conventional photosensitive polyimides or polyimide precursor compositions. Preferably, the photosensitive polyimides or polyimide precursor compositions contains polyamic acids reacted from photosensitive amines such as ODAs (oxydianiline) and anhydrides such as PMDAs (pyromellitic dianhydride) or polyamic acid reacted from photosensitive amines such as ODA (oxydianiline) and anhydrides such as BTDAs (benzophenone tetracarboxylic dianhydride) or PMDAs (pyromellitic dianhydride).

After the pixel-defining layers form, the process for forming organic electroluminescent media and the cathodes of the OLED panels can be achieved subsequently. A plurality of photoresist ramparts form on the substrate with photosensitive polyimide pixel-defining layer through photolithography. The patterns of the photoresist ramparts are not limited. Preferably, the photoresist ramparts are parallel ramparts and have T-shape cross-section. The photoresist ramparts selectively intersect with the anodes and the pixel defining layers. Preferably, the photoresist ramparts selectively intersects with the anodes perpendicularly. The photoresist can be any conventional photoresist. Preferably, the photoresist ramparts are made of positive photoresist. Most preferably, the photoresist ramparts on the panel of the OLEDs are made of positive chemically amplified photoresist compositions that contain photo-acid generators. The ramparts on the substrate of the panels of OLEDs act as ideal shadow masks for subsequent deposition processes and also serves as isolating walls to separate side-deposited cathode materials from anodes.

Organic electroluminescent media are formed after a plurality of first electrodes (anodes) and ramparts are formed. The organic electroluminescent media are deposited on the substrate and selectively on anodes. The organic electroluminescent media are deposited as a single layer or optionally multiple layers (e.g. hole transporting layers, emitting layers, electron transporting layers) on the substrate and selectively on anodes. A plurality of cathodes (second electrodes) then form on the organic electroluminescent media on the substrate. The formation of cathodes (second electrodes) can be achieved through conventional deposition methods. The organic electroluminescent media is sandwiched by cathodes (second electrodes) and the anodes (first electrodes) on the substrate. The open portions where anodes (first electrodes) and cathodes (second electrodes) locate between ramparts are the emitting portions (i.e. pixels) of OLED. The projections of the first electrodes on the substrate intersect those of the second electrodes. Preferably, the projections of the first electrodes (anodes) are perpendicular to the projections of the second electrodes.

FIG. 1 is a partially enlarged perspective view of the panel of the present invention before formation of organic electroluminescent medium and cathodes (second electrodes). A plurality of auxiliary electrodes 70 is formed on the substrate 10 in parallel stripes through photolithography. Then a plurality of anodes (first electrodes) 20 is formed in parallel stripes on the substrate 10. The anodes (first electrodes) 20 are almost in the same height and each first electrode cover two auxiliary electrodes 70. A pixel-defining layer 60 in a pattern of multiple pixel windows is formed on the substrate 10 and first electrodes 20 subsequently. The open windows of the pixel-defining layer 60 locate above part of the anodes (first electrodes) 20. Each stripe of anodes (first electrodes) 20 is separated into several open areas by the pixel-defining layer 60.

The formation of pixel-defining layer 60 is achieved by first spin coating a composition of photosensitive polyimide, precursors on the substrate where the auxiliary electrodes and anodes (first electrodes) 20 locate. The coated substrate is prebaked to drive out the solvent inside the photosensitive polyimide composition. Photosensitive polyimide composition layer with patterns further forms through photolithography. The photosensitive polyimide composition layer is further cured and crosslinked to form a pixel-defining layer on the substrate.

A plurality of ramparts 50 which protrude on the substrate 10 and have T-shape cross-section is formed on the pixel-defining layer 60 and the substrate 10. The ramparts 50 have an overhanging portion projecting in a direction parallel to the substrate 10. The ramparts 50 are in a pattern of parallel stripes and cross over the first electrodes 20 perpendicularly. The open portions between ramparts 50 are above the open window areas of pixel-defining layer 60. The open window areas of pixel-defining layer 60 are the locations of future pixels after subsequent organic electroluminescent media and second electrodes form.

Figure 3:
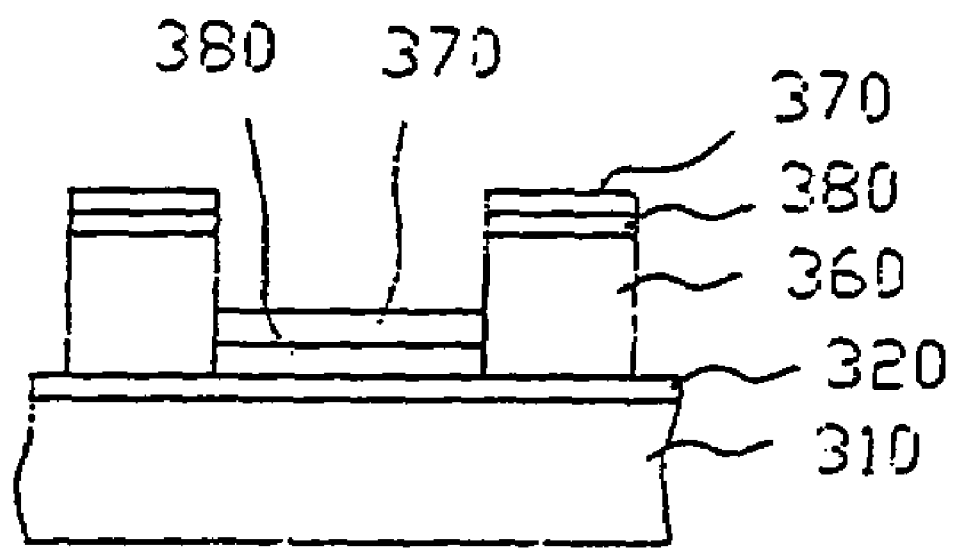
FIG. 3 is a partial cross section view of an embodiment of the invention.

FIG. 3 is a partially cross section view of another embodiment of the panel of the present invention. A plurality of auxiliary electrodes is formed on the substrate 310 in parallel stripes through photolithography. Then a plurality of anodes (first electrodes) 320 is formed in parallel stripes on the substrate 310. The anodes (first electrodes) 320 are almost in the same height and each first electrode 320 cover two auxiliary electrodes. A pixel-defining layer 360 in a pattern of multiple pixel windows is formed on the substrate 310 and first electrodes 320 subsequently. The open windows of the pixel-defining layer 360 locate above part of the anodes (first electrodes) 320. Part of the first electrodes 320 locates in the open window areas of the pixel-defining layer 360. Then the organic electroluminescent media 380 and the second electrodes 370 forms on the exposed first electrodes 320 and on the pixel-defining layer 360. This OLED panel (without isolating walls or ramparts) can be applied for illumination of image-displaying. Moreover, the OLED panel having pixel-defining layer but without ramparts can be also applied to other manufacturing process for increasing functions or improving display qualities. For example, the OLED panel having pixel-defining layer but without ramparts can be also applied to the structure or the further manufacturing of active matrix OLED.

The OLEDs achieved through the method of the present invention can be applied to any display of images, graphs, symbols, letters and characters for any apparatus. Preferably, the OLEDs of the present invention are applied to the display of televisions, computers, printers, screens, vehicles, signal machines, communication devices, telephones, lights, electronic books, microdisplays, fishing machines, personal digital assistants (PDA), game machines, game goggles and airplanes.

More detailed examples are used to illustrate the present invention, and these examples are used to explain the present invention. The examples below, which are given simply by way of illustration, must not be taken to limit the scope of the invention.

EXAMPLE 1

A glass deposited with a layer of ITO and a layer of Cr is applied here as a substrate. A plurality of parallel stripes of Cr auxiliary electrodes form on the substrate through photolithography. The substrate with parallel stripes of Cr is then cleaned fully before further processing. A plurality of transparent ITO anodes in parallel stripes form through photolithography. The Cr auxiliary electrodes are parallel to the ITO anodes. There are two Cr auxiliary electrodes on the surface of each ITO anodes. A layer of photosensitive polyimide is then spin coated on the surface of the substrate with patterned ITO anodes and patterned Cr auxiliary electrodes at a spin rate of 1000 to 3000 rpm. The coated substrate is prebaked in an oven or a hot plate at a temperature ranging from 120° C. to 160° C. The prebaked substrate is exposed to a masked radiation by way of a stepper or aligner. The exposed substrate is immersed or sprayed in a solution of 2.38% of tetramethyl ammonium hydroxide for development. A polyimide layer with open rectangular windows (as shown in the FIG. 2) selectively on the parallel ITO stripes and cover the exposed area between ITO anodes is formed on the surface of the substrate. The substrate coated with the patterned polyimide layer is cured at a temperature of 450° C. to form a pixel-defining layer.

Figure 2:
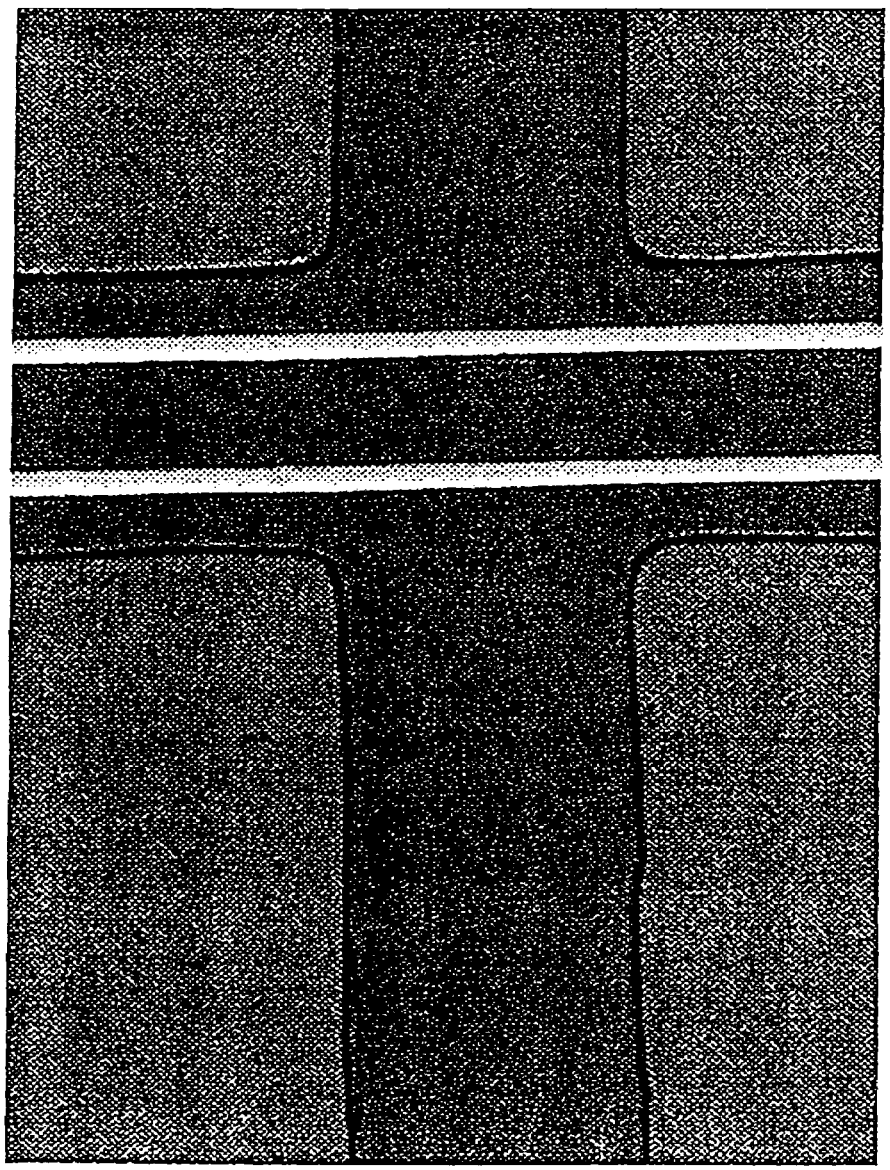
FIG. 2 is a top view of the OLED panel of the present invention.

A layer of positive chemical amplified photoresist composition is coated on the substrate with the pixel-defining layer by spin-coating. The coated substrate is prebaked at a temperature ranging from 90 to 110° C. The prebaked substrate is exposed to a masked radiation by the assistance of a stepper. The exposed substrate is postbaked (PEB) and developed by tetramethyl ammonium hydroxide atmosphere at the same time. A plurality of parallel ramparts having T-shape cross-section form on the transparent ITO anodes after these procedures are finished. The average thickness of these ramparts is 0.8 µm and the average width of these ramparts is 0.18 µm. The exposed anode areas between these ramparts are then deposited by TPD (N,N'-diphenyl-N,N'-bis(3-methylphenyl)-1,1'-biphenyl-4,4'-diamine) at a thickness of 700 Å through vapor deposition. A layer of Alq3 at a thickness of 500 Å A is deposited on the TPD layers through vapor deposition. A layer of Al cathode at a thickness of 1000 Å is deposited on the Alq3 layers through vapor deposition to form the OLED panel (as shown in FIG. 2). The right FIG. 2 is the FIG. 5 in P2951/009-9009TW.

Although the present invention has been explained in relation to its preferred embodiment, it is to be understood that many other possible modifications and variations can be made without departing from the spirit and scope of the invention as hereinafter claimed.

What is claimed is:

1. An OLED panel, comprising:
   a substrate;
   a plurality of first electrodes in parallel stripes, said first electrodes located on the surface of said substrate;
   a photosensitive polyimide or polyimide precursor pixel-defining layer having a pattern of open window areas, said photosensitive polyimide pixel-defining layer selectively located on said first electrodes;
   a plurality of organic electroluminescent media, said organic electroluminescent media at least located in said open window areas on said substrate; and
   a plurality of second electrodes, said second electrodes at least located on said organic electroluminescent media;
   wherein said first electrodes and said second electrodes sandwiched said organic electroluminescent media in said open window areas of said layer of said photosensitive polyimide or polyimide precursor compositions.

2. The OLED panel as claimed in claim 1, wherein said first electrodes are perpendicular to said second electrodes.

3. The OLED panel as claimed in claim 1, wherein said first electrodes are transparent.

4. The OLED panel as claimed in claim 1, wherein said substrate are transparent.

5. The OLED panel as claimed in claim 1, wherein said substrate has a plurality of auxiliary electrodes on or beneath said surface of said substrate.

* * * * *